United States Patent [19]

Sharpe-Geisler

[11] Patent Number: 6,043,969
[45] Date of Patent: Mar. 28, 2000

[54] BALLAST RESISTORS WITH PARALLEL STACKED NMOS TRANSISTORS USED TO PREVENT SECONDARY BREAKDOWN DURING ESD WITH 2.5 VOLT PROCESS TRANSISTORS

[75] Inventor: Bradley A. Sharpe-Geisler, San Jose, Calif.

[73] Assignee: Vantis Corporation, Sunnyvale, Calif.

[21] Appl. No.: 09/114,718

[22] Filed: Jul. 13, 1998

Related U.S. Application Data

[60] Provisional application No. 60/071,687, Jan. 16, 1998.

[51] Int. Cl.$^7$ ........................................................ H02H 9/00
[52] U.S. Cl. ............................... 361/111; 361/56; 361/58; 361/118
[58] Field of Search ............................... 361/56, 58, 111, 361/115, 118, 91

[56] References Cited

U.S. PATENT DOCUMENTS 4,990,802 2/1991 Smooha ..................................... 361/91
5,510,728 4/1996 Huang ........................................ 361/91

*Primary Examiner*—Stephen Jackson
*Attorney, Agent, or Firm*—Fliesler Dubb Meyer & Lovejoy

[57] ABSTRACT

Electrostatic discharge (ESD) protection is provided for NMOS pull up transistors 700A–H and 702A–H of a 5.0 volt compatible output buffer using 2.5 volt process transistors. The ESD protection includes ballast resistors 701A–H and 703A–H separating individual pairs of NMOS pull up transistors 700A–H and 702A–H from the pad and from a power supply connection NV3. The ballast resistors enable turn on of additional pairs of NMOS pull up transistors after a first pair, such as 700A,702A turns on during an ESD event to prevent secondary breakdown in the first NMOS pair. Pairs of NMOS pull up transistors are used to prevent voltages across individual NMOS transistors from exceeding a 2.7 volt maximum while still enabling the transistors to provide 5.0 volts to the pad.

4 Claims, 5 Drawing Sheets

BALLAST RESISTORS WITH PARALLEL STACKED NMOS TRANSISTORS USED TO PREVENT SECONDARY BREAKDOWN DURING ESD WITH 2.5 VOLT PROCESS TRANSISTORS

CROSS-REFERENCE TO RELATED APPLICATION

This application claims the benefit of U.S. Provisional Application Ser. No. 60/071,687, filed Jan. 16, 1998.

BACKGROUND OF THE INVENTION

1. Field of the Invention

The present invention relates to circuitry for providing electrostatic discharge (ESD) protection. More particularly, the present invention relates to components for providing ESD protection for a circuit with components made using a 2.5 volt semiconductor process having a 5.0 volt compatible CMOS I/O.

2. Description of the Related Art

ESD can occur when a human body, or machine comes into contact with lead pins of a chip before the chip is placed in a circuit. ESD can also occur after the chip is placed in a circuit and powered up when a charged up lead pin is accidentally connected to ground. A typical circuit used to test a chip to determine if the chip offers adequate protection during an ESD event includes a series connected resistor and capacitor. To simulate the human body, a resistance of approximately 3000 Ω is utilized in the test circuit along with a capacitance of approximately 10 pF. Because the instantaneous voltage from a human body can be as much as 2000 volts, the capacitor is typically charged up to as much as 3000 volts and connected through the resistor to the lead pin of a chip to assure the chip provides adequate ESD protection.

To prevent damage to circuitry on a chip during an ESD event, the output buffers are typically designed to go into avalanche breakdown to connect a lead pin receiving an electrostatic discharge directly to a ground pin without affecting other circuitry on the chip. FIG. 1 illustrates a portion of a typical output buffer of a chip which is powered down. The buffer includes an NMOS pull up transistor 102 and an NMOS pull down transistor 104. During power down, the gates of transistors 102 and 104 are connected to a ground pin through resistors. The transistors of the buffer are also connected to a pad 100 which is coupled to a lead pin of a chip.

When an ESD event occurs providing up to 3000 volts to the pad, transistor 104 goes into breakdown and then snapback to connect the pad to ground to prevent circuit damage. To describe how snap back occurs during an ESD event to provide ESD protection, reference is made to FIGS. 2 and 3. FIG. 2 shows a cross section of a substrate containing the transistor 104 of FIG. 1. FIG. 3 graphs voltage at the pad vs. current through the source to drain of transistor 104.

In an ESD event, the voltage at the drain region 200 rises quickly. The inductance 201 will limit how quickly voltage rises on the drain region 200. Initially, with a voltage rising on the drain 200, the gate to drain overlap capacitance 208 begins to pull the gate high. The series resistance 210 of the gate initially protects the gate oxide because the voltage drop across the resistor is subtracted from the voltage that would otherwise appear across the gate oxide. As the gate is pulled up, the channel between the drain 200 and source 202 turns on.

The region of highest electric field is the pinch-off region 204 where the conducting electrons reach impact ionization energies, giving rise to electron-hole pair generation. With electroin-hole pair generation, the n+ drain region 200 will further be pulled high, to cause gate aided breakdown by creating a depletion region in the area 204 of the substrate between the gate 206 and region 200. Breakdown occurs initially in region 204 because the highest electric field occurs at this edge of the gate 206. With breakdown initially occurring, electron hole pairs are generated. Holes move away from the pad toward the p− substrate to pull the substrate high. With the p− substrate going high, forward biasing of a diode formed from the p− substrate region to the n+ source region 202 occurs with the n+ region connected to ground through an inductive line 203. With the p− to n+ diode forward biased, electrons will be injected from the region 202 into the p− substrate, which increases the carrier concentration locally. As the carrier concentration increases, the depletion width to maintain a given maximum electric field decreases thus decreasing the voltage drop—hence creating snap back.

As current increases through the transistor 104 beyond a primary breakdown point 300, which occurs at snap back, a secondary breakdown can occur at a point 302 as shown in FIG. 3. Secondary breakdown is destructive to the transistor 104 causing it to essentially melt. The size of transistor 104 is typically set to limit current below secondary breakdown when an ESD event occurs. If the size of the single transistor 104 is insufficient to limit current below secondary breakdown when an ESD event occurs, multiple transistors can be utilized as shown in FIG. 4.

In FIG. 4, three transistors 401–403 are used to connect the pad to ground. With three transistors and no resistors 411–413, when an ESD event occurs, one of the transistors 401–403 will break down first to limit the voltage potential across the source to drain of remaining transistors in 401–403, so the remaining transistors in 401–403 will not turn on. Current will then increase in the transistor which is turned on to cause secondary breakdown in the transistor turned on. To enable all transistors 401–403 to turn on during an ESD event, ballast resistors 411–413 are included in series with the source to drain path of each transistor 401–403. The ballast resistors have resistance values set so that if one of the transistors 401–403 goes into primary breakdown, the voltage applied across the remaining transistors in 401–403 will be enough to turn on those transistors so that current will not increase in one transistor enough to cause a secondary breakdown.

For an ESD event where the pad is pulled negative, referring to FIG. 2, the diode formed by region 200 and the p− substrate will be forward biased causing electron injection into the substrate. A p+ guard region 210 implanted in the substrate near the transistor 104 will complete the circuit to ground and so limits any negative voltage.

The structure for a 5.0 volt compatible output buffer made using a 2.5 volt semiconductor process makes providing ESD protection more difficult. A portion of a 5.0 volt compatible output buffer made using a 2.5 volt transistor process is shown in FIG. 5. The circuit includes two pull down transistors 501–502 with source to drain paths connected in series to connect a pad to ground. The circuit also includes two pull up transistors 503 and 504 with source to drain paths connected in series to connect the pad to a pin power supply voltage Vcc. In operation, when a 5.0 volt difference is applied from the pad to ground, or from Vcc to the pad, voltages are applied to the gates of transistors to prevent a voltage potential difference across any of transistors 501–504 from exceeding 2.7 volts. For example, when 5.0 volts is applied from the pad to ground, 3.3 volts is applied to the gate of transistor 502 to cause a 2.5 volt drop from the pad to node n2. With n2 at 2.5 volts, the gate to source, gate to drain, and source to drain voltages of transistors 501 and 502 do not exceed a maximum of 2.7 volts. Circuitry to control the gate voltage of transistors 501–504, as well as additional circuitry for a 5.0 volt compatible I/O buffer made with a 2.5 volt process, is disclosed in U.S. Patent Application Ser. No. 08/912,763, incorporated herein by reference.

FIG. 6 shows a cross section of a substrate containing either the transistors 503 and 504 of FIG. 5, or transistors 501 and 502 of FIG. 5, with a chip powered down. During an ESD event, when a high voltage is applied to the pad, with the gate of transistor 601 grounded, and the n+ region 616 of transistor 602 grounded, the n+region 610 will be pulled high to initiate gate aided breakdown. With breakdown beginning, electron hole pairs are separated and the holes will move away from the region 610 toward the p– substrate to pull the substrate high. With the p– substrate going high, forward biasing of a diode formed from the p– substrate region to the n+source region 616 occurs, since region 616 is grounded. With the p– to n+ (616) diode forward biased, electrons will be injected from the region 616 into the p– substrate to eventually cause snap back.

However, with transistors 501 and 502 of FIG. 5 spaced close enough to allow snap back for ESD protection, snap back can also occur during normal operation. During normal operation, the source of transistor 501 is grounded, a condition needed for snap back. When the output switches from high to low, current through the source to drain of transistor 502 can give rise to hot carrier generation creating electron-hole pairs that can charge up the p– substrate so that snap back can occur.

To prevent snap back during normal operation, the transistors 501 and 502 of FIG. 5 can be physically separated in the substrate. However, with transistors 501 and 502 physically separated to an extent needed to prevent snap back during normal operation, snap back will not occur during an ESD event. Current during an ESD event sufficient to cause breakdown at a region 611 in FIG. 6, as well as a region 615 will damage circuitry on a chip containing the buffer.

It is, therefore, desirable to provide a new ESD protection mechanism for a 5.0 volt compatible I/O buffer made using a 2.5 volt process, where two series transistors are required from a pad to ground.

SUMMARY OF THE INVENTION

The present invention includes ESD protection for an output buffer including at least two series NMOS pull down transistors and two series NMOS pull up transistors.

For ESD protection for the series NMOS pull down transistors, the present invention includes one or more lateral bipolar junction transistors (BJTs) which are preferable NPN devices for providing ESD protection during an ESD event without experiencing gate oxide damage, since the BJTs do not have a gate oxide. The lateral NPN transistors can be formed by implant regions provided in a p– epitaxial layer of a p type substrate. The lateral NPN transistors each have a first implant region coupled to a ground lead pin, and a second implant region forming a base connected by another BJT to a pad which is connected to the two series pull down NMOS transistors. A third implant region of the lateral NPN transistor also connects to the pad. The lateral NPN transistors function to turn on during an ESD event due to charge up of the p– epitaxical region to connect the pad to ground.

The present invention further includes circuitry to clamp the pad voltage to a maximum value during an ESD event to prevent damage to the gate oxide of the 2.5 volt process CMOS transistors. The clamping circuitry includes a PMOS transistor with a first end of a source to drain path coupled to a base of a BJT which is a PNP device connecting the base of the lateral NPN transistor to the pad. The PNP transistor coupled to the PMOS transistor can be connected with another PNP transistor between the pad and lateral NPN transistor to form a Darlington pair. The Darlington pair assures a low impedance path between the pad and the base of the lateral NPN to limit voltage on the pad during an ESD event. During power down, the gate of the PMOS transistor is essentially at ground to assure turn on during an ESD event. Circuitry is further included to connect the gate of the PMOS transistor to a voltage to turn off the PMOS transistor during normal operation. A multiplexer may further be included to set the gate voltage of the PMOS transistor during normal operation to clamp the pad voltage to a desired maximum value.

ESD protection for the series NMOS pull up transistors in one embodiment includes parallel stacked NMOS transistors coupled by ballast resistors between a Vcc lead pin connection and the pad. The parallel stacked NMOS transistors serve as series connected pull up transistors for an output buffer. During an ESD event the ballast resistors prevent a single series pair of pull up transistors from entering secondary breakdown before other pairs of pull up transistors turn on. Snap back is used for ESD protection for pull up transistors because during normal operation snap back of an NMOS pull up transistors is not a concern because no nearby n+ region is provided which is grounded so that even if the p– substrate were somehow pulled up, no diode exists to forward bias.

ESD protection for the series NMOS pull up transistors in a second embodiment also includes a p+ guard ring region surrounding each pair of NMOS pull up transistors. Typically, the p+ guard ring is provided around an entire group of transistors, rather than individual transistors to prevent pull up of the substrate. The p+ guard rings are connected to each other with metal rings surrounding individual NMOS pull up transistors enables pull up of the p– epitaxical region during an ESD event. With one set of series connected NMOS transistors turning on during an ESD event, its surrounding p+ guard ring will pull up the p– epitaxical region around other sets of series connected NMOS transistors. Pull up of the p– region for other pull up transistor pairs will cause turn on of the other pairs to prevent secondary breakdown in the first NMOS pair. The p+ guard ring, thus, functions similar to ballast resistors and may be provided in conjunction with smaller ballast resistors to assure secondary breakdown does not occur.

BRIEF DESCRIPTION OF THE DRAWINGS

Further details of the present invention are explained with the help of the attached drawings in which.

DETAILED DESCRIPTION

Figure 7:
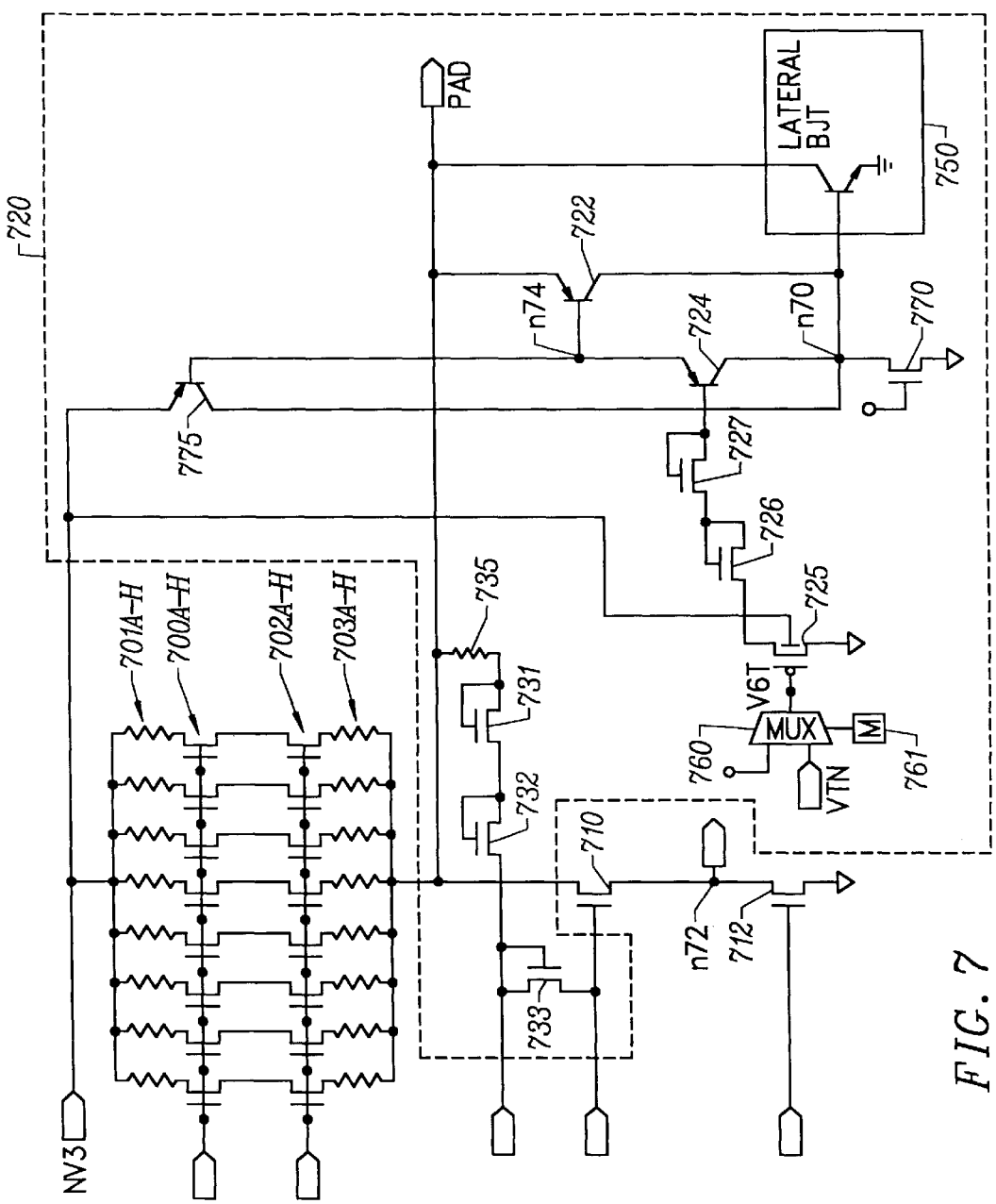
FIG. 7 shows a portion of a circuit for a 5.0 volt compatible I/O made using a 2.5 volt process with circuitry of the present invention for providing ESD protection.

FIG. 7 shows a portion of a circuit for a 5.0 volt compatible I/O made using a 2.5 volt process with circuitry of the present invention for providing ESD protection. The portion of the I/O circuit shown in FIG. 7 includes an output buffer with series connected pull up transistors 700A–H and 702A–H, connecting a 3.3 volt supply pin NV3 to the pad. The output buffer further includes series connected pull down transistors 710 and 712, connecting the PAD to ground.

I. ESD Protection For Pull Down Transistors Of Output Buffer

A. Lateral NPN Transistor

As indicated previously, with the source of transistor 712 connected to ground and transistors 712 and 710 closely spaced, snap back can occur in normal operation. To prevent snap back during normal operation, transistors 710 and 712 are separated in distance and by a guard region. Should an ESD event occur with a high voltage applied to the pad connected to the drain of transistor 710, additional circuitry 720 is included to handle such an ESD event.

The circuitry 720 includes a lateral BJT 750, which is an NPN transistor. With the transistor 750 being a BJT, it will have no gate oxide, unlike NMOS transistors 710 and 712. For a 2.5 volt device, the gate oxide for CMOS transistors can only handle approximately 2.7 volts.

Figure 8:
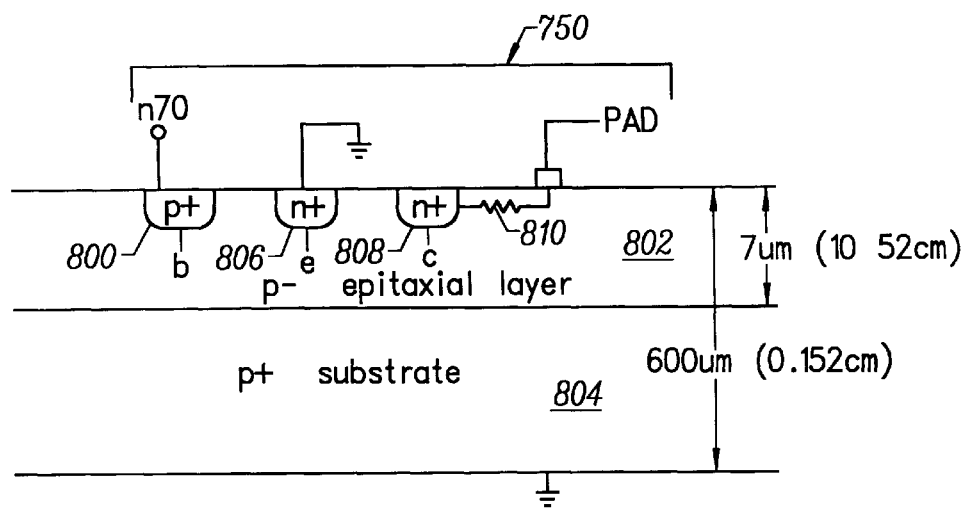
FIG. 8 shows structure of the lateral BJT of FIG. 7.

The structure of the lateral BJT 750 in the form of an NPN device is shown in FIG. 8. The BJT 750 is provided in a p– epitaxial layer 800 on a p+ substrate 804. In one embodiment, the p+ substrate 804 is heavily doped to provide a 0.1 Ω-cm resistivity and is approximately 600 μm thick, while the p– epitaxial layer is approximately 7 μm thick, and is lightly doped to provide about a 10 Ω-cm resistivity.

The lateral BJT 750 as shown in FIG. 8 is formed by n+ implant regions 806 and 808 in the p– epitaxial layer 802 along with a p+ implant region 800. As indicated above, the BJT 750 shown is, thus, an NPN device. The n+ region 806 forms an emitter region for the lateral BJT and is connected to ground, while the n+ region 808 forms a collector region which is connected by a ballast resistor to the pad. The p+ implant region 800 connects to a contact node n70 and forms a base region for the BJT 750. The node n70 is also shown in FIG. 7.

With the pad being coupled to node n70, during an ESD event when a large voltage is applied between the pad and a ground pin, node n70 will pull up the p– epitaxial region 802 to turn on the lateral BJT 750. Similar to gate aided breakdown, with transistor 750 turning on, the pad will be connected to ground.

In one embodiment, multiple lateral BJTs 750 are included with the base of each transistor being coupled to node n70, while collectors and emitters of each lateral transistor are coupled in parallel between the pad and ground. Such parallel connected transistors enable the pad to discharge quickly when an ESD event occurs so that a charge build up will not occur on the pad, and so that smaller lateral BJTs may be used without damage due to handling excessive current. To assure no damage occurs to a single lateral BJT during an ESD event when multiple transistors are used for lateral BJT 750, ballast resistors, such as ballast resistor 810 shown in FIG. 8, can be used between the pad and collector region of each lateral BJT. The ballast resistors enable other BJTS to turn on before a single BJT which turns on first can be damaged.

B. Circuitry To Clamp Pad Voltage

The ESD protection circuitry further includes circuitry to clamp the pad voltage below a desired maximum value during an ESD event to prevent damage to transistors 710 and 712, as well as to prevent turn on of the ESD protection circuit during normal operation. Such circuitry includes BJTs 722 and 724, and CMOS transistors 725–727. Such circuitry further includes transistors 731–733 and resistor 735.

The BJTs 722 and 724 are PNP type transistors forming a Darlington pair. A Darlington pair offers a low emitter impedance since the transistors 722 and 724 are connected as emitter followers with the emitter of 724 connected to the base of 722. With the emitter of transistor 722 connected to the pad, a low impedance path is offered from the pad to node n70 to carry the potentially high ESD current without a correspondingly high voltage increase. Further, PNP BJTs 722 and 724 are used in the path between the pad and ground because they do not have a gate oxide which can be damaged by a potentially high ESD voltage.

Figure 10:
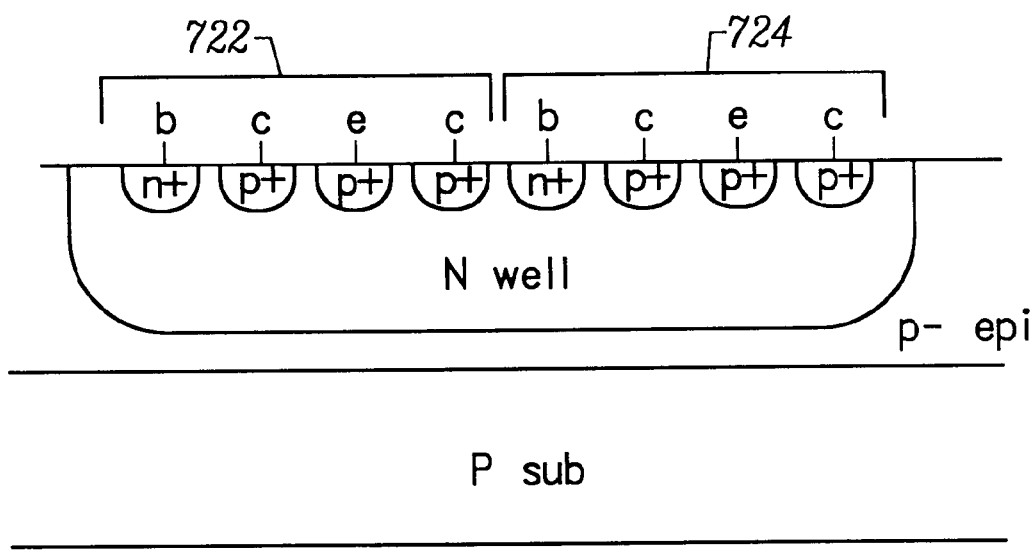
FIG. 10 shows a cross section of the PNP transistors of FIG. 7.

FIG. 10 shows a cross section of the PNP transistors 722 and 724. As shown, the transistors 722 and 724 include an n+ base region (b) along with p+collector (c) and emitter (e) regions in an N well provided in the P substrate. As further shown in FIG. 10, the transistor 724 actually utilizes two collectors. One collector of transistor 724 is connected to the epitaxial layer 802 as well as to the transistor 770.

The transistor 770 connects to node n70 as shown in FIG. 7. When the chip is powered up, the base of transistor 770 is connected to Vcc to turn it on to effectively connect the p– epitaxial layer in the p substrate to ground and prevent the p– epitaxial layer from charging up. During an ESD event when the chip is powered down, the transistor 770 will have a gate at ground, permitting the p– epitaxial region to be pulled up by transistors 722 and 724 to turn on transistor 750.

The base of BJT 724 of FIG. 7 is driven in an ESD event by transistors 725–727. Transistor 725 is a PMOS transistor as indicated by a circle on its gate, while transistors 726 and 727 are NMOS transistors without such a gate circle. In the circuit 720 with the part powered down, VGT at the gate of transistor 725 will be at ground. With an ESD event where the pad goes up and the gate of transistor 725 is grounded, transistors 725–727 will turn on.

With the transistors 725–727 turning on during an ESD event, the pad is connected to NV3 through a stack of five diodes including transistors 725–727 and CMOS transistors 725–727. The body of transistor 725 is connected to NV3 and forms the first diode. Transistors 726–727 are NMOS are connected with a drain and gate together to form two additional diodes, and transistors 722 and 724 form base to emitter diodes. With transistors 725–727 on and so configured, 1 vt will be provided across each transistor, where vt is the threshold for an MOS transistor of approximately 0.7 volts. Further, 0.7 volts will be provided from the base to emitter of each of the BJTs 722 and 724. Thus, the total voltage on the pad will be 3.5 volts.

With the pad raised above 3.5 volts, transistors 722 and 724 will start to turn on to will conduct a limited current to pull up node n70 and limit the pad voltage with the lateral BJT 750 turning on. Although transistors 726 and 727 are shown as NMOS devices, BJTs similarly connected in a diode fashion may be used. Further, if a different pad voltage than 3.5 volts is desired during an ESD event, a greater or fewer number of the transistors 726–727 may be used. Further, although transistors 722 and 724 are shown connected in as a Darlington pair, a single BJT could be utilized with an emitter to collector path provided between the pad and node n70 and a base coupled to the gate of transistor 727.

As indicated, the ESD protection circuit 720 further includes transistors 731–733. The transistors 731–733 and a resistor 735 connect the pad to the gate of transistor 710. The gates of the transistors 731–733 are tied to their drains. As connected, when the pad charges up to a level of 3 vt (≈2.0 volts) above the gate of transistor 710, the transistors 731–733 will turn on to begin to pull up the gate of transistor 710. Transistor 710 will then turn on to apply a 4 vt (≈2.7 volt) drop from the pad to node n72. A maximum voltage on the pad will be controlled to be limited, as discussed previously. With the pad rising above 3.5 volts, with 2.0 volts on its gate and a source to drain voltage drop of 2.7 volts, transistor 710 will not exceed a 2.7 volt maximum for a 2.5 volt device. Similarly, with a 2.7 volt drop across the drain to source of transistor 710, and 0 volts on the gate of 712, node n72 will be at the pad voltage minus 2.7 volts, and transistor 712 will not exceed a 2.7 volt maximum for a 2.5 volt device.

C. Optimization Circuitry

The ESD circuit 720 can include a multiplexer 760 and memory cell 761 to alternatively clamp the voltage on the pad during normal operation when an ESD event is not occurring. The pad voltage is clamped by controlling the VGT voltage. By setting VGT, the transistor 725 will turn on enabling the lateral BJT 750 to turn on when the pad exceeds a maximum voltage. The maximum pad voltage can be controlled by appropriately controlling the multiplexer 760 using memory cell 761. For a 5.0 volt output, the multiplexer 760 is controlled to provide Vcc=2.5 volts to VGT. The maximum voltage on the pad will then be 3.5 volts+2.5 volts=6.0 volts. For a 3.3 volt device, a reference voltage of approximately 1 vtn can be applied to VGT. The maximum voltage on the pad will then be 3.5 volts+0.7 volts=4.2 volts. With transistor 750 utilized during normal operation when an ESD event is not occurring, the gate of transistor 770 will be grounded as it will be during an ESD event. If the transistor 750 is not used during normal operation, the gate of transistor 770 will be connected to Vcc.

To further optimize the operation of the circuit 720, a transistor 775 may optionally be included as shown in FIG. 7. The transistor 775 serves to limit the capacitance between the base and emitter of the PNP transistor 722. The transistor 775 is connected to NV3 which is the 3.3 volt pin connection, as well as to the channel of transistor 725. When transistor 725 turns on during an ESD event, the node NV3 can be pulled up to 3.3 volts. Transistor 775 will then provide a 1 vt drop from the NV3 node to pull node n74 at the base of transistor 722 to 2.6 volts. When an ESD event occurs and the base of 722 is at 0 volts, when the pad is pulled high the base-emitter diode of transistor 722 will forward bias until the base of 722 is pulled up. The capacitance on the base of transistor 775 shows up in the emitter load current as the base capacitance multiplied by the gain of transistor 775. The base of transistor 775 will be formed so that its capacitance will be a large n-well capacitance. If the collector of transistor 724 is grounded, its base capacitance will show up at its emitter multiplied by its gain. The capacitance at the emitters of transistors 775 and 724 then add up to provide a considerable amount of gain. Once the node n74 is pulled up to 1 vt below 3.3 volts, the capacitance described no longer shows up.

Although the BJT transistors 722 and 724 are shown used in conjunction with a lateral BJT transistor 750, if transistors 722 and 724 are made large enough, transistor 750 may be eliminated. With transistor 750 eliminated, node n70 would simply be grounded and transistors 722 and 724 would function to clamp the pad.

II. ESD Protection For Pull Up Transistors Of Output Buffer

A. Ballast Resistors With Series Pull Up Transistors

The transistors 700A–H and 702A–H serve as NMOS pull up transistors, as well as ESD protection circuitry for an output buffer of the present invention. The transistors 700A–H and 702A–H can be used for ESD protection because the drains of transistors 700A–H are connected to a 3.3 volt supply pin during normal operation rather than to a ground pin, preventing snap back from occurring during normal operation as it would with transistors 710 and 712.

With transistors 700A–H and 702A–H being 2.5 volt process devices, their gate to source, gate to drain, and source to drain voltages cannot exceed approximately 2.7 volts. To prevent excessive voltages across transistors 700A–H and 702A–H, series connected transistor pairs, such as 700A–702A are used. Further, appropriate gate voltages are applied during normal operation to prevent component damage.

For example, with the pad voltage being high, 4.5 volts can be applied to the gates of transistors 700A–H and 702A–H. With a gate voltage of 4.5 volts applied, transistors 700A–H and 702A–H will both turn on and a voltage drop greater than 2.7 volts will not occur across either transistor. When the pad is to be driven low, 2.5 volts can be applied to the gates of transistors 700A–H, while 0.0 volts is applied to the gates of transistors 702A–H. With the pad voltage low, the voltage at the sources of each of transistors 700A–H will be its gate voltage minus an NMOS threshold, assumed here to be approximately 0.7 volts, making the voltage at the sources of transistors 700A–H approximately 1.8 volts. Thus, the drain to source voltage drop across transistors 700A–H will be 1.5 volts which is less than the maximum tolerable 2.7 volts. Details of circuitry used to provide voltages to transistors 700A–H, 702A–H, 710 and 712 can be found in U.S. patent application Ser. No. 08/912,763, referenced previously.

Figure 4:
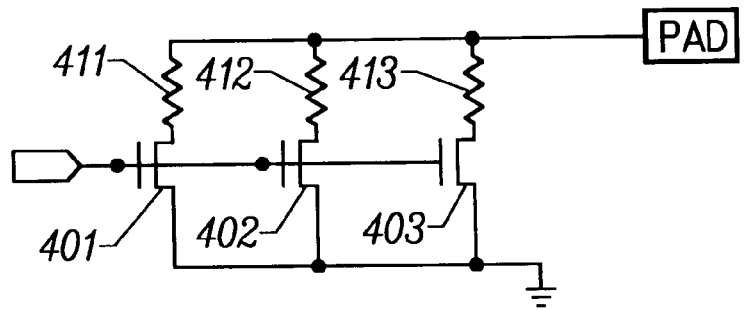
FIG. 4 shows a how multiple series connected transistors can be used in place of a single pull down transistor in FIG. 1.
Figure 5:
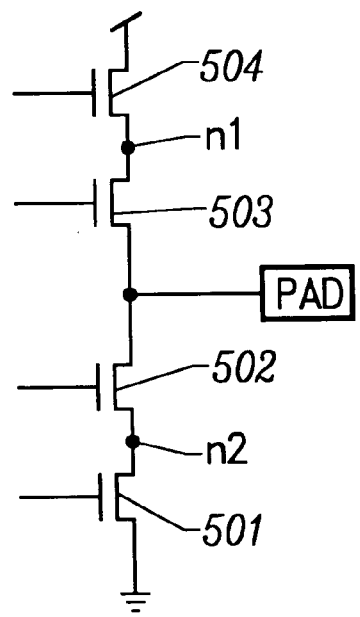
FIG. 5 shows a 5.0 volt compatible output buffer made using a 2.5 volt transistor process.

To provide ESD protection when a high voltage is applied between the pad and the 3.3 volt supply pin connection, transistors 700A–H and 702A–H are placed adjacent to each other. To assure that the transistors 700A–H and 702A–H can handle current in an ESD event, multiple parallel transistors are used, as described with respect to FIG. 4. Further, to assure all transistors 700A–H and 702A–H turn on during an ESD event, ballast resistors 701A–H can be used between transistors 700A–H and the 3.3 volt supply connection, and ballast resistors 703A–H can be used between each transistor 702A–H and the pad, as described with respect to FIG. 4.

Although FIG. 7 shows only two series pull up transistors, such as 700A–702A, or two series pull down transistors 710 and 712, additional series connected transistors might be utilized if the two pull up and pull down transistors are insufficient to provide the desired voltage drop from a reference to the output node, or from the output node to ground.

B. P+ Guard Ring With Series Pull Up Transistors

ESD protection for the series NMOS pull up transistors 700A–H and 702A–H can also include a p+ guard ring region surrounding each pair of NMOS pull up transistors. Such a p+ guard ring will function similar to the ballast resistors by enabling other series connected pull up transistors to turn on after a first pair of pull up transistors turns on to prevent damage to the first pair. Such a p+guard ring can be used either alone, or in combination with the ballast resistors to provide ESD protection.

Figure 6:
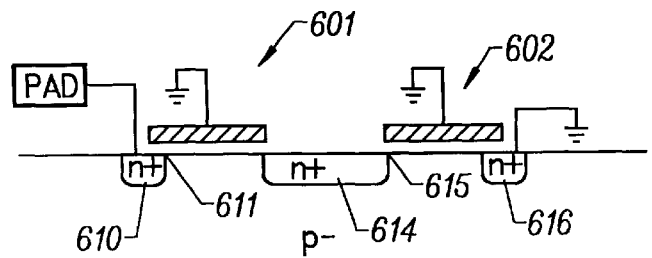
FIG. 6 shows a cross section of a substrate containing the transistors 503 and 504 of FIG. 5 with a chip powered down.
Figure 9:
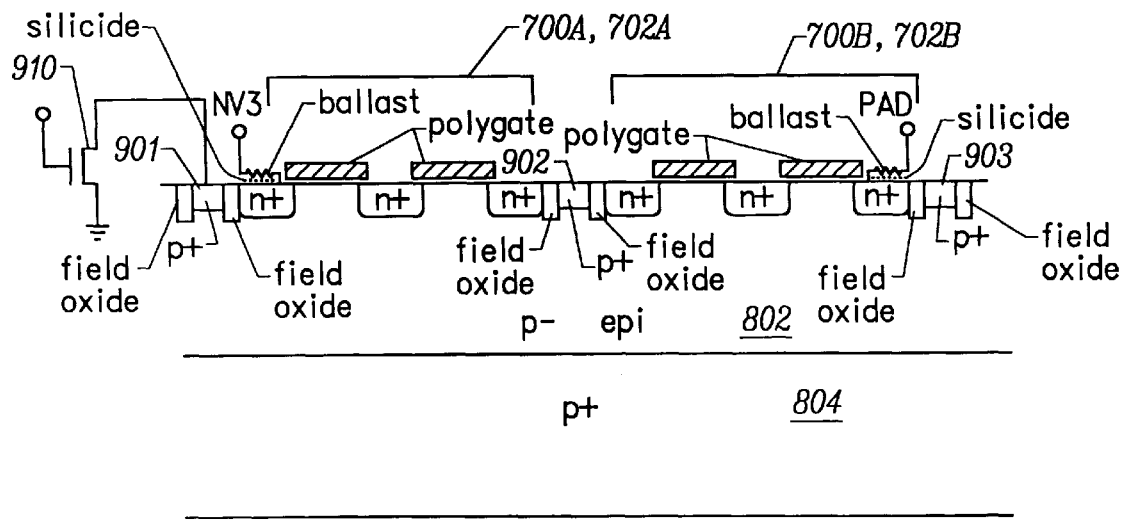
FIG. 9 shows a cross section of pull up transistors of FIG. 7.

FIG. 9 shows a cross section of transistors 700A, 702A, 700B and 702B. As shown, each transistor pair 700A–702A and 700B–702B includes components similar to those shown in FIG. 6. Further, field oxide regions separate the transistor pairs along with interdigital p+ guard rings 901–903. Normally, a single p+ guard ring surrounds an entire group of transistors, rather than pairs of transistors as shown in FIG. 9. Although not shown, the p+ guard rings 901–903 are connected together and to p+ guard rings surrounding all of transistors 700A–H and 702A–H.

In operation, when an ESD event occurs and snap back occurs in one pair of transistors, such as pair 700A–702A, the p– epitaxial region will be charged up under the transistors 700A–702A. With the p– epitaxial region under transistors 700A–702A pulled up, p+ guard ring regions 902 and 903 will also pull up. With the p+ regions surrounding the transistors 700A–H and 702A–H, the p+ regions 901–903 being pulled up will contribute to the p– region under other transistor pairs pulling up. With the p– region under other transistor pairs pulled up, those transistor pairs will more readily go into snap-back, because as the p– epitaxial region is pulled up, the drain of tranistors 700A–H becomes forward biased.

Figure 1:
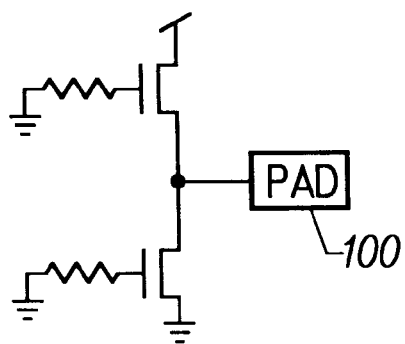
FIG. 1 shows a typical output buffer on a powered down chip.
Figure 2:
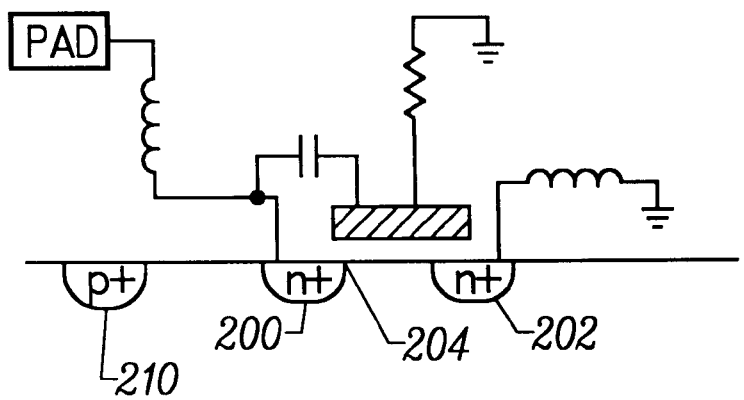
FIG. 2 shows a cross section of a substrate containing a transistor of FIG. 1.
Figure 3:
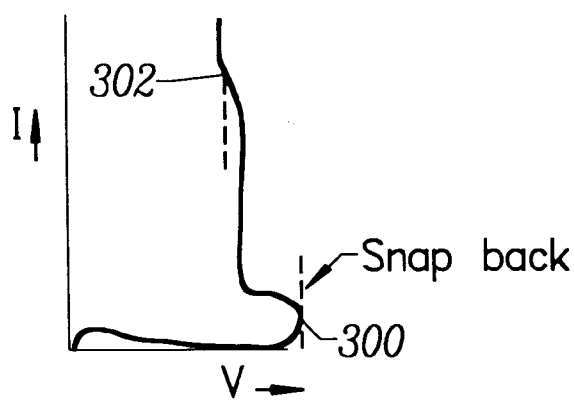
FIG. 3 graphs voltage at a pad vs. current through the source to drain of a transistor of FIG. 1.

Referring to FIG. 3, transistor 910 is connected to the p+ guard ring regions surrounding transistors 700A–H and 702A–H. During normal operation, Vcc is applied to the gate of transistor 910 to turn it on so the p+ guard ring regions will be grounded. With the p+ guard ring regions grounded, the p– epitaxial substrate region will not pull up and snap back will be prevented since neither the source or drain terminal of transistors 700A–H are grounded, unlike with transistor 712. With the part powered down, the transistor 910 will turn off, the p+ guard ring regions will not be grounded and can serve with the ballast resistors to assure that transistors 700A–H and 702A–H turn on basically together.

Although the present invention has been described above with particularity, this was merely to teach one of ordinary skill in the art how to make and use the invention. Many additional modifications will fall within the scope of the invention, as that scope is defined by the claims which follow.

What is claimed is:

1. An electrostatic discharge (ESD) protection circuit provided on an integrated circuit (IC) comprising:

pull up circuits connected in parallel between a pad and a power supply connection node, the pad being further coupled to a lead pin, the parallel pull up circuits each comprising:

NMOS pull up transistors having source to drain paths connected in series between the pad and the power supply connection node; and ballast resistors coupling the series connected source to drain paths of the NMOS pull up transistors between the pad and the power supply connection node.

2. The ESD protection circuit of claim 1, wherein the ballast resistors comprise first resistors each coupling a first end of the source to drain path of one of the NMOS pull up transistors to the pad.

3. The ESD protection circuit of claim 2, wherein the ballast resistors comprise second resistors each coupling a second end of the source to drain path of one of the NMOS pull up transistors to the power supply connection node.

4. The ESD protection circuit of claim 1, wherein the ballast resistors comprise resistors each coupling one end of the source to drain path of one of the NMOS pull up transistors to the power supply connection node.

* * * * *